(12) United States Patent
Deak

(10) Patent No.: US 6,807,087 B2
(45) Date of Patent: Oct. 19, 2004

(54) WRITE CURRENT SHUNTING COMPENSATION

(75) Inventor: James G. Deak, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/231,041

(22) Filed: Aug. 30, 2002

(65) Prior Publication Data
US 2004/0042260 A1 Mar. 4, 2004

(51) Int. Cl.$^7$ ................................................ G11C 11/00
(52) U.S. Cl. .............. 365/158; 365/189.01; 365/189.04
(58) Field of Search ........................... 365/158, 189.01, 365/189.04, 171, 173

(56) References Cited

U.S. PATENT DOCUMENTS

| | | |
|---|---|---|
| 5,329,480 A | 7/1994 | Wu et al. |
| 5,640,343 A | 6/1997 | Gallagher et al. |
| 5,734,605 A | 3/1998 | Zhu et al. |
| 5,793,697 A * | 8/1998 | Scheuerlein ........... 365/230.07 |
| 6,215,707 B1 | 4/2001 | Moyer |
| 6,351,409 B1 * | 2/2002 | Rizzo et al. ................. 365/158 |
| 6,385,079 B1 | 5/2002 | Tran |
| 6,466,475 B1 | 10/2002 | Nickel |
| 6,490,217 B1 | 12/2002 | DeBrosse et al. |
| 6,538,921 B2 | 3/2003 | Daughton et al. |
| 6,621,730 B1 * | 9/2003 | Lage ........................... 365/158 |

\* cited by examiner

*Primary Examiner*—Anh Phung
*Assistant Examiner*—Pho M. Luu
(74) *Attorney, Agent, or Firm*—Dickstein Shapiro Morin & Oshinsky LLP

(57) ABSTRACT

A magnetic random access memory (MRAM) is compensated for write current shunting by varying the bit size of each MRAM cell with position along the write line. The MRAM includes a plurality of magnetic tunnel junction memory cells arranged in an array of columns and rows. The width of each memory cell increases along a write line to compensate for write current shunting.

19 Claims, 6 Drawing Sheets

WRITE CURRENT SHUNTING COMPENSATION

BACKGROUND OF THE INVENTION

1. Field of the Invention

The invention relates to electronic devices, especially magnetic random access memories, and more specifically to magnetic random access memory arrays compensated for write current shunting.

2. Description of the Related Art

Magnetic random access memory (MRAM) typically is made up of memory cells that store information based on a direction of magnetization of a ferromagnetic region. MRAM cells can hold stored information for long periods of time, and are thus nonvolatile.

MRAM memory generally takes the form of an array of intersecting, electrically-conductive column and row lines formed on a substrate. An MRAM memory cell is located at each intersection of the array.

Various types of MRAM memory cells are known in the prior art. U.S. Pat. No. 5,640,343, issued Jun. 17, 1997 to Gallagher et al., discloses an MRAM device that utilizes an array of Magnetic Tunnel Junction (MTJ) memory cells. Each MTJ MRAM memory cell includes a magnetic tunnel junction. As shown in FIG. 7, a magnetic tunnel junction 70 includes three functional layers: a free ferromagnetic layer 72, a tunnel barrier 74, and a fixed or pinned ferromagnetic layer 76. The magnetization direction of pinned layer 76 is fixed by exchange coupling with an antiferromagnetic material. The magnetization direction of the free ferromagnetic layer 72, in the absence of an applied field, is oriented along either a positive or a negative axis, as indicated by the double-headed arrow.

Conductance of the MTJ memory cell is determined by the alignment of the magnetization in the fixed and free ferromagnetic layers. Accordingly, binary information can be stored in each memory cell based on the relative alignment of the magnetization direction in each layer. When the alignment is parallel (both magnetizations oriented in the same direction) the MTJ has a lower magnetoresistance, representing a logic 0, for example. When the alignment is antiparallel (the magnetizations oriented in opposite directions), the resistance of the MTJ is higher, representing a logic 1. The magnetoresistance is the result of spin-polarized tunneling of conduction electrons between the ferromagnetic layers. Measuring the magnetoresistance indicates the alignment, and thus the logical state, of the cell.

Changing the orientation of the magnetization of the free ferromagnetic layer changes the logic state of the cell. The magnetization of the free layer will rotate in the presence of an applied magnetic field. The magnetic field is applied by way of an electric current flowing in the conductive word and bit lines. A current in both lines generates a magnetic field of sufficient strength to change the orientation state of the memory cell. The current of at least one of the lines has to be reversible to write the two different magnetic states of the cell.

SUMMARY OF THE INVENTION

The present invention overcomes the deficiencies of the prior art by compensating for write current shunting in an MRAM array. Write current shunting is defined as the undesired leakage current that flows through an MRAM cell during a write operation, due to the finite resistance of the cell and the difference in the potentials of write conductors on opposite sides of the cell. According to a preferred embodiment, MRAM cells are arranged along a write line such that the cells progressively increase in physical size, from the high potential side to the low potential side. Write current requirements decrease with increasing cell size. Consequently, write current shunting is compensated by making cells larger at the end of the write line farthest from the high potential voltage input.

According to one aspect of the invention, the array is designed so that the cell width increases monotonically from high to low potential side of the write line. According to another aspect of the invention, compensating for current shunt by distributing cell size in the array allows more bits to be provided on the same write line, thereby reducing the number of transistors in the array and increasing bit density.

DETAILED DESCRIPTION OF THE PREFERRED EMBODIMENTS

Figure 1:
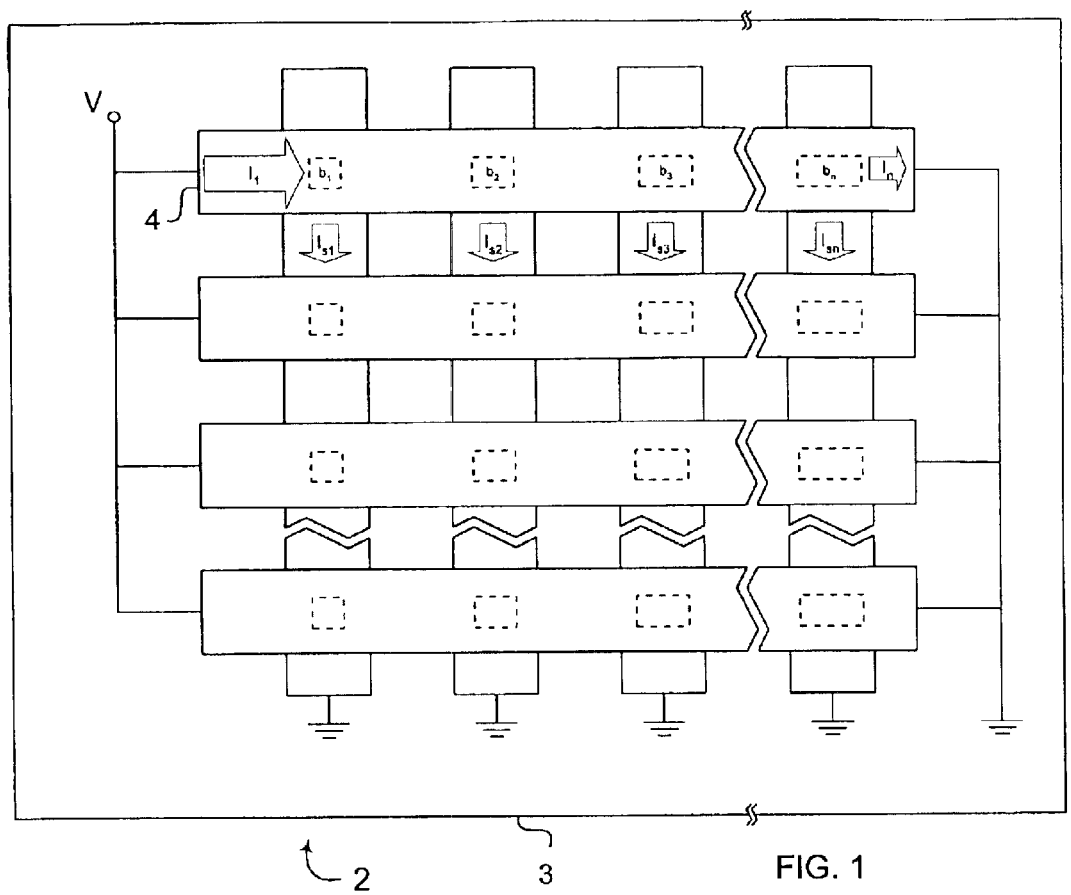
FIG. 1 is a plan view of a magnetic random access memory device according to the present invention, illustrating current shunting.
Figure 8:
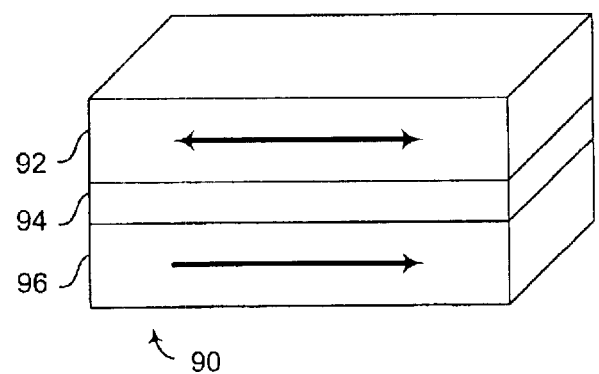
FIG. 8 illustrates a prior art magnetic tunnel junction memory cell.

MRAM arrays, such as MTJ array 2 shown in FIG. 1, exhibit measurable amounts of write current shunting through the memory cells to adjacent lines, as illustrated by the arrows in FIG. 1. Consequently, the write current applied to the write conductors 4 drops with distance along a write conductor, from the high potential side to the low potential side (left to right as shown in FIG. 1), due to the current shunting that takes place through the MTJ cell to adjacent read or write lines. The effective write field applied to an MRAM cell for a fixed value of I, applied in a write conductor thus decreases along the length of the conductor. As a result, bit yield is degraded in MTJ MRAM arrays.

The effect is described with reference to FIGS. 1–3. Referring initially to FIG. 1, an MRAM array 2 is shown formed on a substrate 3. The MRAM array is made up of a plurality of column and row lines, with a memory cell formed at each line junction. A voltage potential V is applied to a column line 4 having n memory cells representing n logic bits $b_i$ ($b_l$ through $b_n$). When a write current $I_l$ is applied at the high potential side of column line 4, an effective write current $I_n$ is available at the low potential side of column line 4. Write current $I_n$ is less than $I_l$ ($I_n < I_l$) due to currents $I_{s1}, I_{s2}, I_{s3} \ldots I_{sn}$ which shunt through bits $b_i$ into the adjacent row line conductors $Row_i$ ($Row_l$ through $Row_n$) used to select bits for writing.

Figure 2:
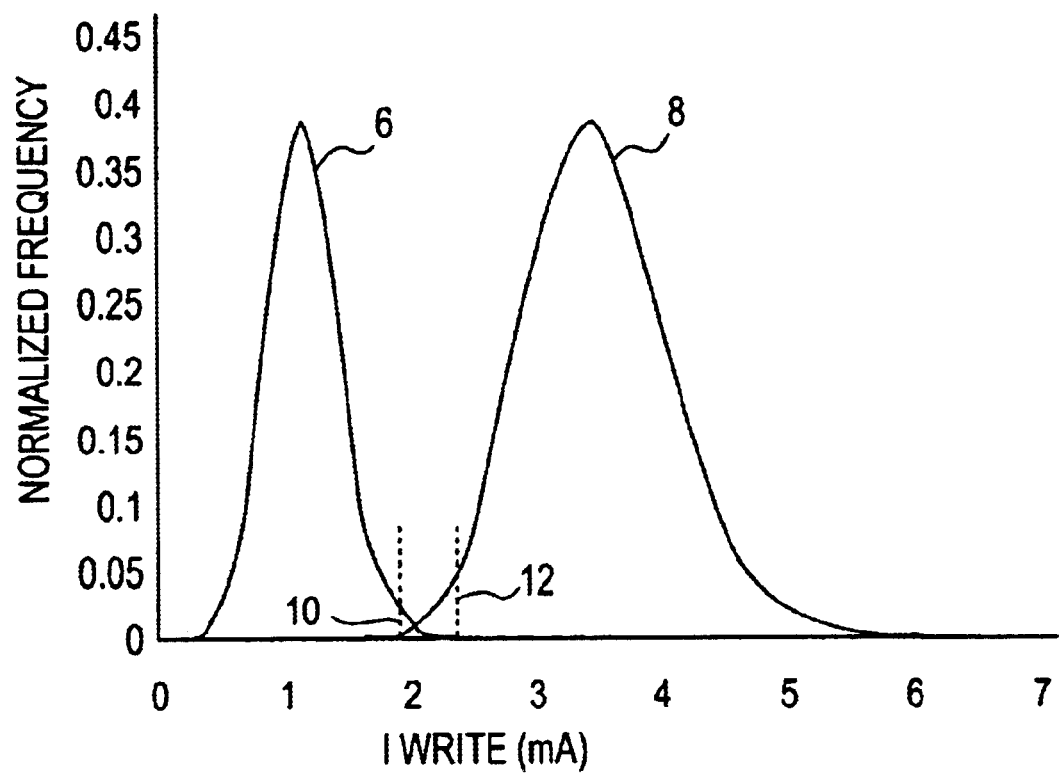
FIG. 2 is graph illustrating the effect of shunting on the write margin.

Referring to FIG. 2, the effect of shunting on the write current margin is illustrated graphically. FIG. 2 represents the distribution of write currents along a column line that exhibits significant write current shunting. Line 6 represents write current distributions for selected bits, and line 8 represents write current distributions for unselected bits. An overlap of lines 6 and 8 is apparent between dotted lines 10 and 12, representing the bit yield degradation due to unselected bits having the same write currents as selected bits.

Figure 3:
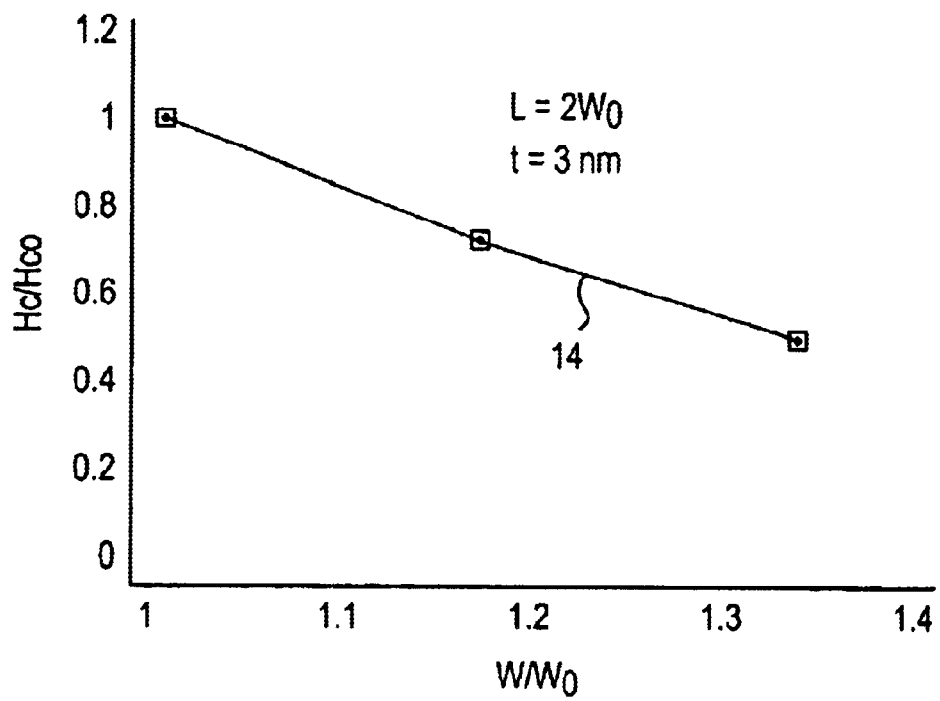
FIG. 3 is a graph illustrating the relationship between switching field and MRAM bit width.

Referring to FIG. 3, the dependence of MRAM cell switching field (Hc) on bit width (W) is illustrated graphically. Line 14 shows a substantially linear inverse relationship between decreasing $Hc/Hc_o$ and increasing bit width $W/W_0$.

Figure 4:
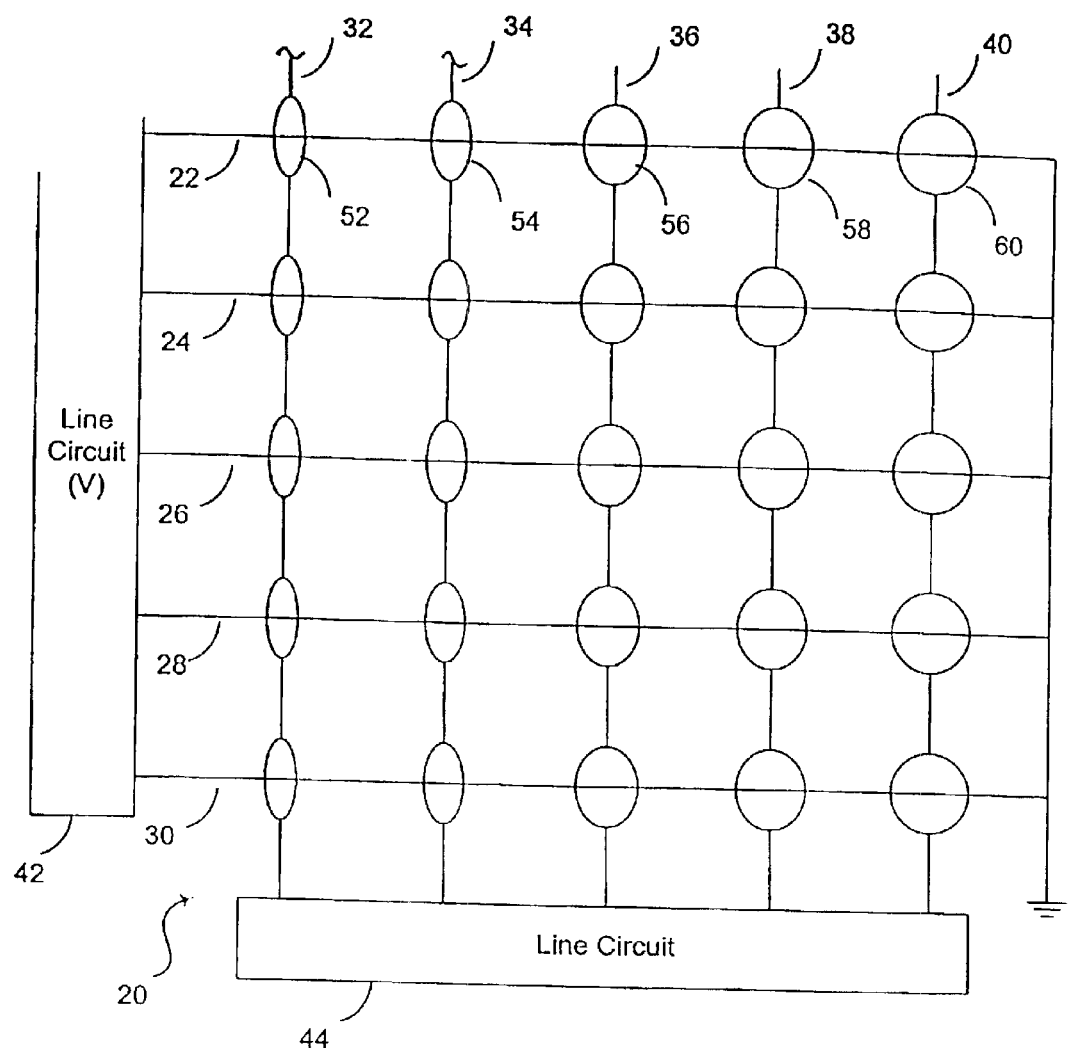
FIG. 4 is a diagram illustrating an MRAM array according to the present invention.

An MRAM array 20 according to a preferred embodiment of the present invention is illustrated in FIG. 4. Array 20 includes column lines 22, 24, 26, 28 and 30, and row lines 32, 34, 36, 38 and 40. Columns and rows are selected by line circuits 42 and 44, respectively. At the intersection of each column and row line is an MTJ cell, MTJ cells in column 22 being designated 52, 54, 56, 58, and 60. The width of cells 52–60 increases along the length of column line 22 to compensate for shunt currents.

Figure 5:
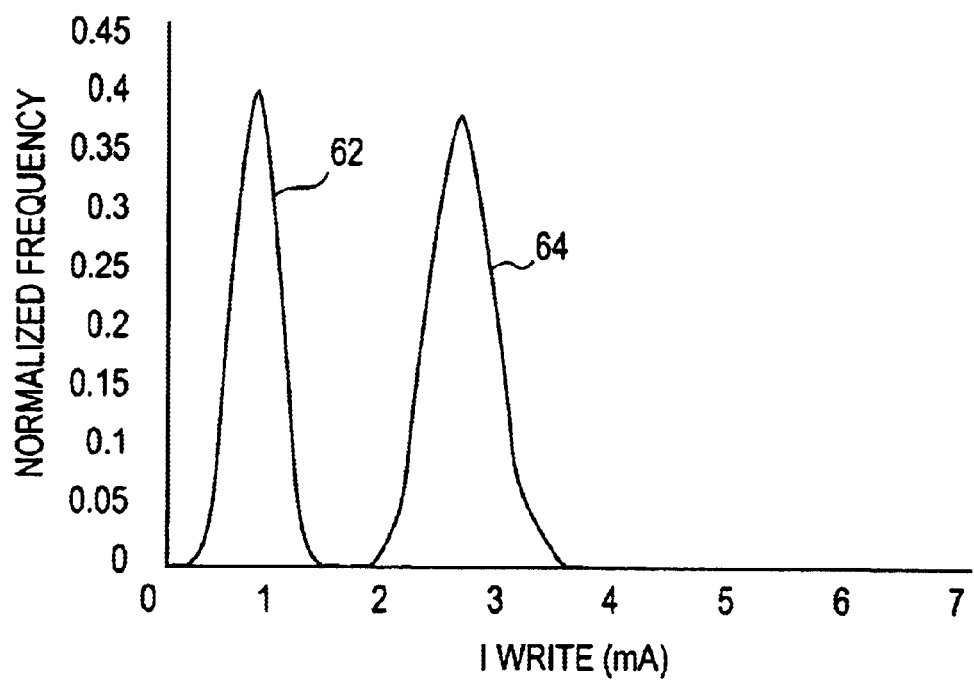
FIG. 5 is a graph illustrating the effect of bit size compensation on shunting current losses.

Referring to FIG. 5, the effect of increasing bit width along the length of a write line on the distribution of write currents is shown graphically. Line 62 shows the distribution of currents for selected cells, and line 64 shows current distributions for unselected cells. Significantly, no overlap exists between lines 62 and 64.

Figure 6:
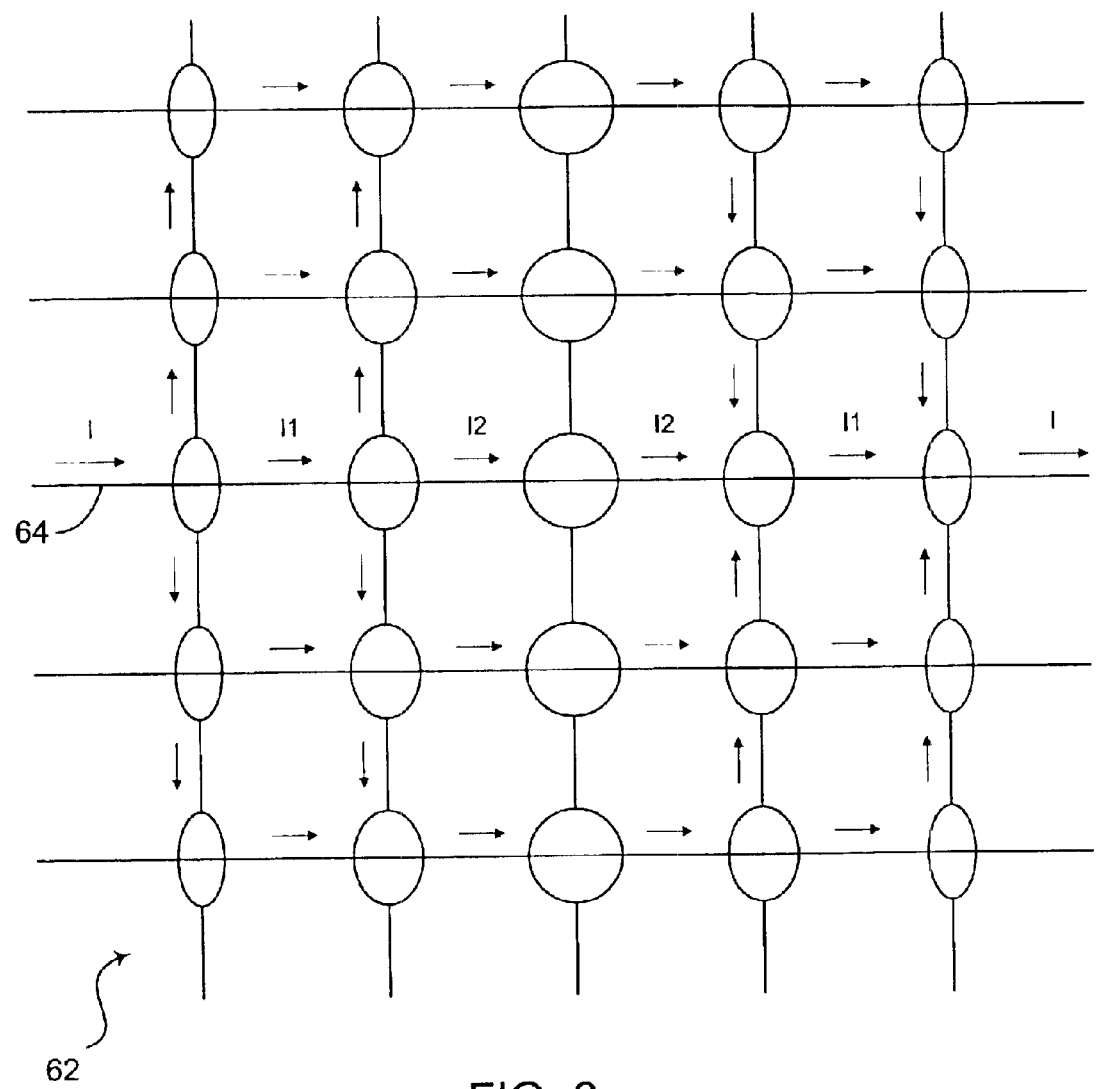
FIG. 6 illustrates an alternative version of the present invention.

Referring to FIG. 6, a variation of the present invention as applied in a memory array architecture 62 that includes floating read conductors, for example. A current I injected on write conductor 64 results in a lowest write current at the center of the write conductor ($I_2<I_1<I$). Accordingly, compensation for shunting is greatest at the center of the write conductor, as shown.

Figure 7:
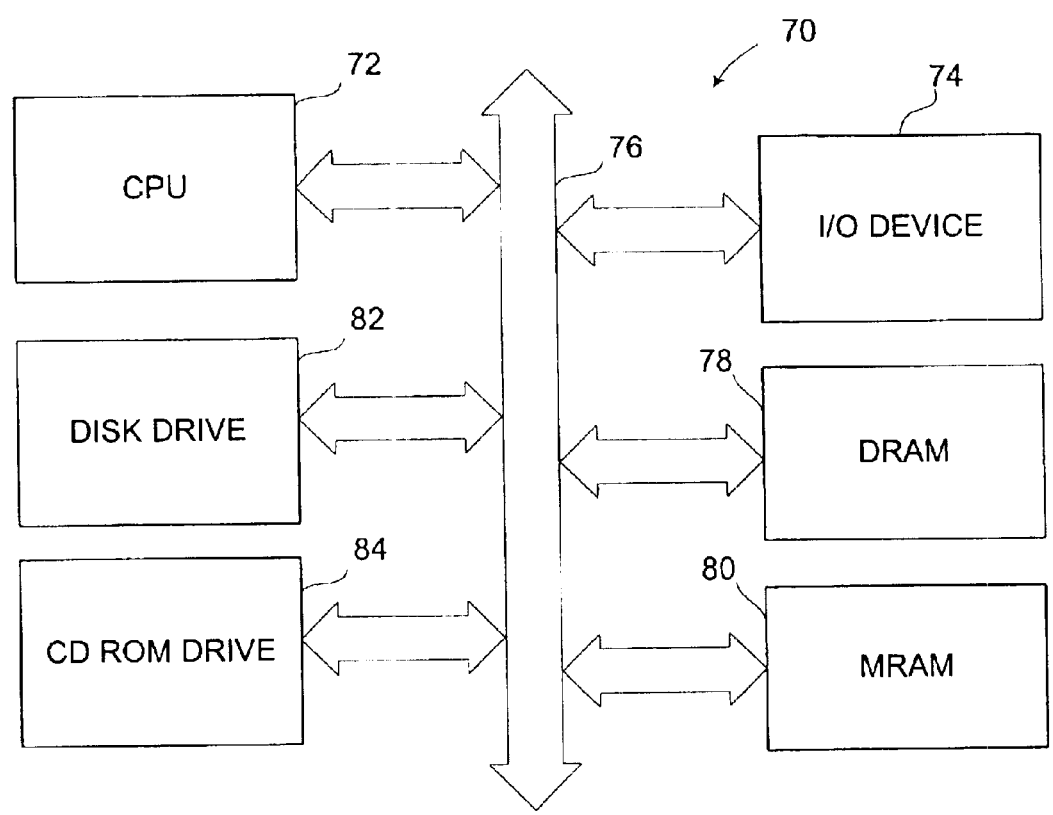
FIG. 7 illustrates a microprocessor based system including an MRAM according to the present invention.

FIG. 7 illustrates a microprocessor based system 70 in which an MRAM 80 according to the present invention is utilized. System 70 includes a CPU 72 and a user input/output (I/O) device 74 connected to a system bus 76. System 70 also includes DRAM 78. MRAM 80 communicates with the other components by way of system bus 76. Other peripheral devices include a disk drive 82 and a CD ROM drive 84.

While preferred embodiments of the invention have been described and illustrated above, it should be understood that these are exemplary of the invention and are not to be considered as limiting. For example, although an exemplary embodiment of the present invention has been described in connection with an MTJ MRAM, the invention is not so limited, and the arrangement of different sized bits can be adjusted to compensate current shunting in any architecture. Additions, deletions, substitutions, and other modifications can be made without departing from the spirit or scope of the present invention. Accordingly, the invention is not to be considered as limited by the foregoing description but is only limited by the scope of the appended claims.

What is claimed is:

1. A magnetic random access memory (MRAM) array comprising:
    a write line; and
    a plurality of MRAM cells positioned along the write line, a physical size of each MRAM cell varying respectively with position along the write line.

2. The MRAM array of claim 1, wherein a width of each MRAM cell varies.

3. The MRAM array of claim 1, further comprising a potential source applied to a beginning of the write line, the physical size of each respective MRAM cell increasing progressively from the beginning of the write line to an end of the write line.

4. The MRAM array of claim 1, wherein the plurality of MRAM cells includes magnetic tunnel junction storage elements.

5. The MRAM array of claim 1, wherein the physical size of each MRAM cell increases progressively from ends of the write line toward a center of the write line.

6. A magnetic random access memory (MRAM) device comprising:
    a write line;
    a potential source applied to a beginning of the write line; and
    a plurality of magnetic tunnel junction cells positioned along the write line, a width of each respective cell increasing progressively from the beginning of the write line to an end of the write line.

7. A random access storage device comprising:
    a substrate; and
    a plurality of MRAM cells disposed on the substrate in an array provided with read lines and write lines, each of the plurality of MRAM cells being configured and positioned along a respective write line according to each cell's write current requirements to compensate for write current shunting.

8. The device of claim 7, wherein the write current shunting is compensated by way of a physical size of each MRAM cell.

9. The device of claim 8, the physical size of each respective MRAM cell increasing progressively from a beginning of a each respective write line to an end of the respective write line.

10. A microprocessor system comprising:
    a microprocessor; and
    a random access memory device including a plurality of MRAM cells compensated for write current shunting by configuring and positioning each of the plurality of MRAM cells along a respective write line according to each cell's write current requirements.

11. The microprocessor system of claim 10, wherein each of the plurality of MRAM cells is compensated for write current shunting by having a physical size of each MRAM cell based on its position along a write line in relation to a write potential source of the random access memory device.

12. The microprocessor system of claim 11, wherein the physical size of each MRAM cell is determined by its width.

13. The system of claim 11, wherein the physical size of each MRAM cell increases progressively from a high potential side to a low potential side of the write line.

14. A method of fabricating a magnetic memory device, the method comprising forming a plurality of magnetic memory cells in an array and configuring a physical size of each memory cell based upon cell position along a write line so as to compensate for write current shunting.

15. The method of claim 14, wherein the magnetic memory device is a magnetic random access memory (MRAM).

16. The method of claim 15, wherein each of the plurality of magnetic memory cells is a magnetic tunnel junction cell.

17. The method of claim 14, wherein the physical size is configured such that at least one physical dimension increases for each respective memory cell along the write line from a high potential end to a low potential end of the write line.

18. A method of manufacturing a magnetic memory array, the method comprising the steps of forming magnetic memory cells on a substrate in a row and column arrangement, a physical size dimension of each respective memory cell in a column increasing from a high potential side of the column to a low potential side of the column.

19. The method of claim 18, wherein the step of forming magnetic cells includes forming magnetic tunnel junction cells.

* * * * *

UNITED STATES PATENT AND TRADEMARK OFFICE
CERTIFICATE OF CORRECTION

PATENT NO. : 6,807,087 B2  
DATED : October 19, 2004  
INVENTOR(S) : James G. Deak It is certified that error appears in the above-identified patent and that said Letters Patent is hereby corrected as shown below:

<u>Column 4,</u>  
Line 24, "of a each" should read -- of each --.

Signed and Sealed this

Nineteenth Day of April, 2005

JON W. DUDAS  
*Director of the United States Patent and Trademark Office*